United States Patent
Lian

(10) Patent No.: US 12,238,958 B2
(45) Date of Patent: Feb. 25, 2025

(54) ORGANIC ELECTROLUMINESCENCE MODULE, ENCAPSULATING METHOD THEREOF, AND DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Wendong Lian, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 0 days.

(21) Appl. No.: 17/622,818

(22) PCT Filed: Dec. 20, 2021

(86) PCT No.: PCT/CN2021/139814
§ 371 (c)(1),
(2) Date: Dec. 25, 2021

(87) PCT Pub. No.: WO2023/108696
PCT Pub. Date: Jun. 22, 2023

(65) Prior Publication Data
US 2024/0032324 A1 Jan. 25, 2024

(30) Foreign Application Priority Data
Dec. 16, 2021 (CN) .......................... 202111540929.X

(51) Int. Cl.
*H10K 59/00* (2023.01)
*H10K 50/844* (2023.01)

(52) U.S. Cl.
CPC .............................. *H10K 50/844* (2023.02)

(58) Field of Classification Search
None
See application file for complete search history.

(56) References Cited

U.S. PATENT DOCUMENTS

| | | | | |
|---|---|---|---|---|
| 2008/0157656 A1* | 7/2008 | Liao | ................... | H10K 50/8445 313/553 |
| 2013/0330531 A1* | 12/2013 | Moro | ..................... | H10K 85/00 204/192.15 |

(Continued)

FOREIGN PATENT DOCUMENTS

| CN | 104241320 A | 12/2014 |
|---|---|---|
| CN | 104946186 A | 9/2015 |

(Continued)

OTHER PUBLICATIONS

International Search Report in International application No. PCT/CN2021/139814, mailed on Aug. 31, 2022.

(Continued)

*Primary Examiner* — Bilkis Jahan
(74) *Attorney, Agent, or Firm* — PV IP PC; Wei Te Chung

(57) ABSTRACT

An organic electroluminescence module, an encapsulating method, and a display device are provided. The organic electroluminescence module includes a substrate, an organic electroluminescent device disposed on the substrate, a first encapsulation layer disposed on a side of the organic electroluminescent device away from the substrate, and a second encapsulation layer disposed on a side of the first encapsulation layer away from the substrate. The first encapsulation layer is capable of preventing a gas generated by the second encapsulation layer from entering the organic electroluminescent device.

15 Claims, 2 Drawing Sheets

(56) References Cited

U.S. PATENT DOCUMENTS

| | | | | |
|---|---|---|---|---|
| 2014/0151656 A1* | 6/2014 | Zeng | ................. | C23C 16/45525 |
| | | | | 428/411.1 |
| 2015/0171375 A1* | 6/2015 | Setz | .................... | H10K 50/818 |
| | | | | 257/40 |
| 2016/0093828 A1* | 3/2016 | Kim | .................... | H10K 50/844 |
| | | | | 257/40 |
| 2017/0077446 A1* | 3/2017 | Li | ........................ | H10K 50/846 |
| 2017/0213999 A1* | 7/2017 | Kim | ....................... | H10K 71/00 |

FOREIGN PATENT DOCUMENTS

| | | | |
|---|---|---|---|
| CN | 105304676 | A | 2/2016 |
| CN | 105762090 | A | 7/2016 |
| CN | 206293441 | U | 6/2017 |
| CN | 107104203 | A | 8/2017 |
| CN | 109585684 | A | 4/2019 |
| CN | 111048687 | A | 4/2020 |
| CN | 111180481 | A | 5/2020 |
| CN | 112563432 | A | 3/2021 |

OTHER PUBLICATIONS

Written Opinion of the International Search Authority in International application No. PCT/CN2021/139814, mailed on Aug. 31, 2022.

Chinese Office Action issued in corresponding Chinese Patent Application No. 202111540929.X dated Jan. 18, 2023, pp. 1-9.

* cited by examiner

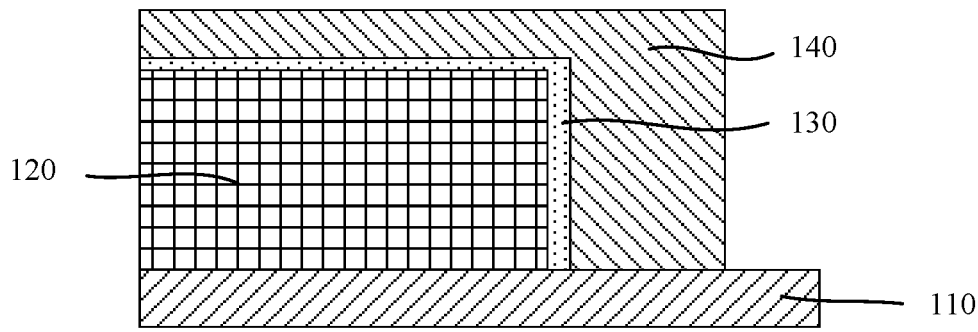
FIG. 1
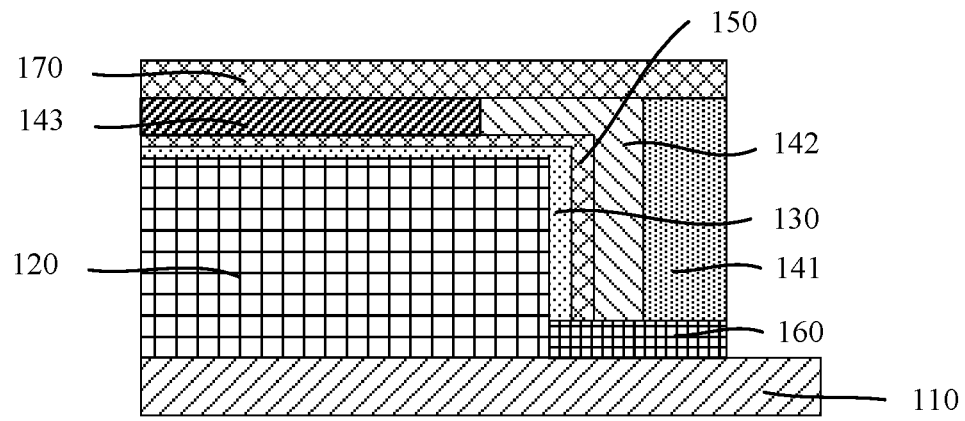
FIG. 2
```
providing a substrate, and forming an organic electroluminescent device on the     — S11
                                    substrate
                                        ↓
forming a first encapsulation layer on a side of the organic electroluminescent    — S12
                        device away from the substrate
                                        ↓
forming a second encapsulation layer on a side of the first encapsulation layer away — S13
                              from the substrate
```
FIG. 3

ORGANIC ELECTROLUMINESCENCE MODULE, ENCAPSULATING METHOD THEREOF, AND DISPLAY DEVICE

FIELD OF DISCLOSURE

The present disclosure relates to the field of organic light emitting diode technologies, in particular to an organic electroluminescence module, an encapsulating method thereof, and a display device.

BACKGROUND

An organic electroluminescence module includes a substrate and an organic electroluminescent device disposed on the substrate. The organic electroluminescent device includes an anode, an organic light-emitting layer, and a cathode. The existing organic electroluminescence module has a short lifespan. A main reason is that electrodes of the organic electroluminescent device and organic light-emitting materials of the organic light-emitting layer are very sensitive to atmospheric pollutants, moisture, and oxygen. In particular, in an environment rich in moisture and oxygen, the organic electroluminescent device is prone to electrochemical corrosion.

In the prior art, in order to protect an internal structure of the organic electroluminescence module, the organic electroluminescence module is encapsulated. An organic capsulation adhesive is often used to bond the substrate and an encapsulation cover plate, and the organic electroluminescent device is encapsulated in a box-shaped encapsulation cavity formed by the two. However, the organic capsulation adhesive will produce small molecular substances during use. The small molecule substance is generally a volatile gas.

SUMMARY OF DISCLOSURE

The small molecular substances will affect a performance of the organic electroluminescence module and shorten its lifespan.

Embodiments of the present disclosure provide an organic electroluminescence module, an encapsulating method thereof, and a display device. The organic electroluminescence module can prevent an organic electroluminescent device from being corroded by a gas generated by a second encapsulation layer, ensure a stable performance of the organic electroluminescence module, and extend a lifespan of the organic electroluminescence module.

In a first aspect, an embodiment of the present disclosure provides an organic electroluminescence module, including:
  a substrate;
  an organic electroluminescent device disposed on the substrate;
  a first encapsulation layer disposed on a side of the organic electroluminescent device away from the substrate; and
  a second encapsulation layer disposed on a side of the first encapsulation layer away from the substrate.

The first encapsulation layer is configured to prevent a gas generated by the second encapsulation layer from entering the organic electroluminescent device, and the second encapsulation layer is configured to prevent moisture or oxygen from entering the organic electroluminescent device.

In a second aspect, an embodiment of the present disclosure also provides an encapsulating method of an organic electroluminescence module, including:
  providing a substrate, and forming an organic electroluminescent device on the substrate;
  forming a first encapsulation layer on a side of the organic electroluminescent device away from the substrate; and
  forming a second encapsulation layer on a side of the first encapsulation layer away from the substrate.

The first encapsulation layer is configured to prevent a gas generated by the second encapsulation layer from entering the organic electroluminescent device, and the second encapsulation layer is configured to prevent moisture or oxygen from entering the organic electroluminescent device.

In a third aspect, an embodiment of the present disclosure also provides a display device, including an organic electroluminescence module. The organic electroluminescence module includes:
  a substrate;
  an organic electroluminescent device disposed on the substrate;
  a first encapsulation layer disposed on a side of the organic electroluminescent device away from the substrate; and
  a second encapsulation layer disposed on a side of the first encapsulation layer away from the substrate.

The first encapsulation layer is configured to prevent a gas generated by the second encapsulation layer from entering the organic electroluminescent device, and the second encapsulation layer is configured to prevent moisture or oxygen from entering the organic electroluminescent device.

The organic electroluminescence module of the embodiment of the present disclosure includes the substrate, the organic electroluminescent device disposed on the substrate, the first encapsulation layer, and the second encapsulation layer. The first encapsulation layer is capable of preventing the gas generated by the second encapsulation layer from entering the organic electroluminescent device. The second encapsulation layer is capable of preventing moisture or hydrogen from entering the organic electroluminescent device. Therefore, the organic electroluminescence module can prevent the gas generated by the second encapsulation layer from corroding the organic electroluminescent device, ensure a stable performance of the organic electroluminescence module, and extend a lifespan of the organic electroluminescence module.

BRIEF DESCRIPTION OF DRAWINGS

In order to more clearly describe technical solutions in embodiments of the present disclosure, the following will briefly introduce drawings needed in the description of the embodiments. Apparently, the drawings in the following description are only some embodiments of the present disclosure. For those skilled in the art, other drawings can be obtained based on these drawings without creative efforts.

In order to have a more complete understanding of the present disclosure and its beneficial effects, the following description will be given in conjunction with the accompanying drawings. In the following description, the same reference numerals indicate the same parts.

FIG. 1 is a schematic diagram of a first structure of an organic electroluminescence module of an embodiment of the present disclosure.

FIG. 2 is a schematic diagram of a second structure of an organic electroluminescence module of an embodiment of the present disclosure.

FIG. 3 is a flowchart of an encapsulating method of an organic electroluminescence module of an embodiment of the present disclosure.

DETAILED DESCRIPTION

Figure 4:
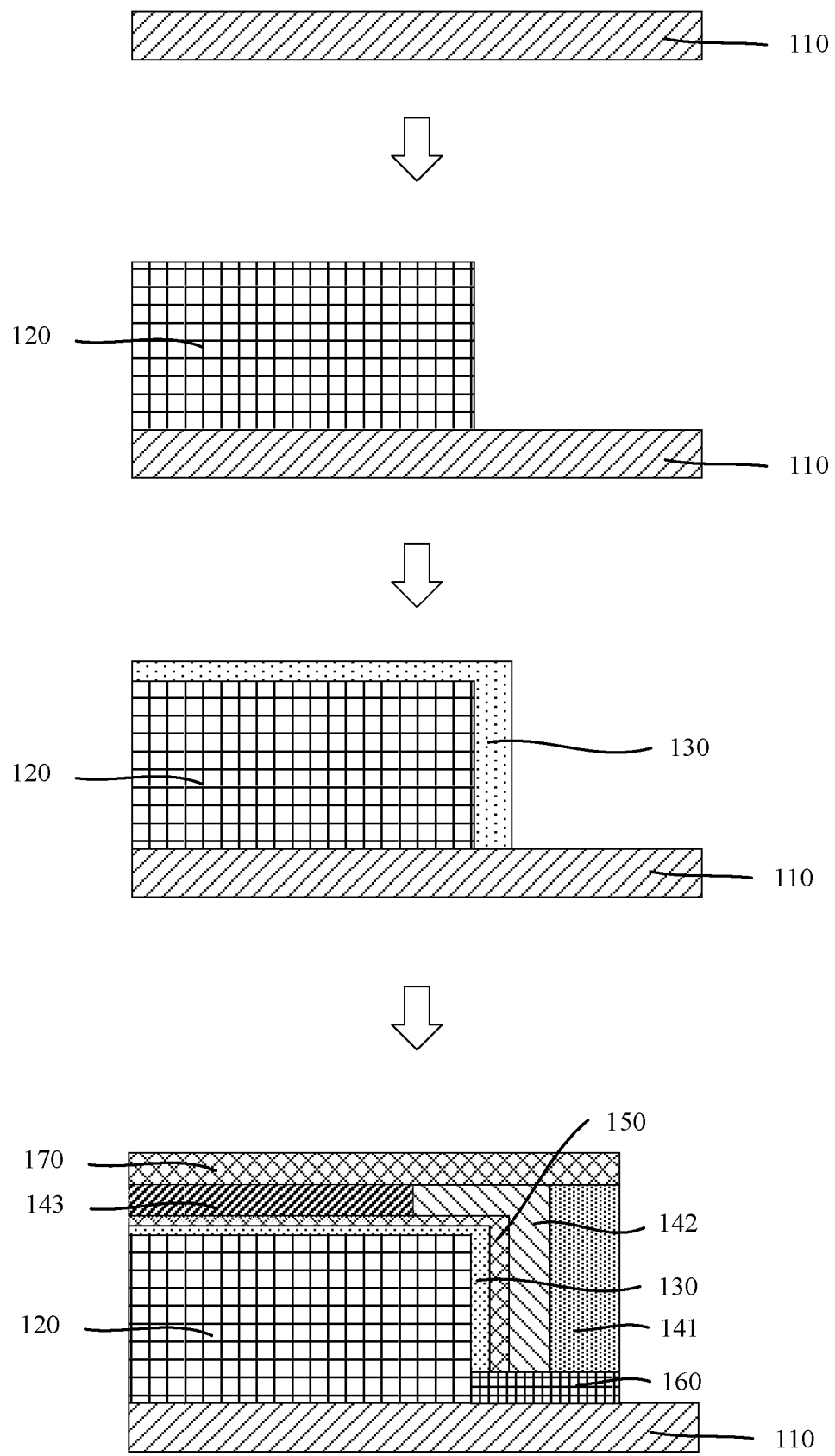
FIG. 4 is a schematic diagram showing a process of manufacturing an organic electroluminescence module of an embodiment of the present disclosure.

The technical solutions in the embodiments of the present disclosure will be clearly and completely described below in conjunction with the drawings in the embodiments of the present disclosure. Apparently, the described embodiments are only a part of the embodiments of the present disclosure, rather than all the embodiments. Based on the embodiments in the present disclosure, all other embodiments obtained by those skilled in the art without creative efforts shall fall within the scope of protection of the present disclosure.

An organic electroluminescence module includes a substrate and an organic electroluminescent device disposed on the substrate. The organic electroluminescent device includes an anode, an organic light-emitting layer, and a cathode. An existing organic electroluminescence module has a short lifespan. A main reason is that electrodes of the organic electroluminescent device and organic light-emitting materials of the organic light-emitting layer are very sensitive to atmospheric pollutants, moisture, and oxygen. In particular, in an environment rich in moisture and oxygen, the organic electroluminescent device is prone to electrochemical corrosion.

In the prior art, in order to protect an internal structure of the organic electroluminescence module, the organic electroluminescence module is encapsulated. An organic capsulation adhesive is often used to bond the substrate and an encapsulation cover plate, and the organic electroluminescent device is encapsulated in a box-shaped encapsulation cavity formed by the two. However, the organic capsulation adhesive will produce small molecular substances during use. The small molecule substance is generally a volatile gas. The small molecular substances will affect a performance of the organic electroluminescence module and shorten its lifespan. The embodiments of the present disclosure provide an organic electroluminescence module, an encapsulating method thereof, and a display device, which will be described in detail below with reference to the accompanying drawings.

Referring to FIG. 1, which is a schematic diagram of a first structure of an organic electroluminescence module of an embodiment of the present disclosure.

An embodiment of the present disclosure provides an organic electroluminescence module 100. The organic electroluminescence module 100 includes a substrate 110, an organic electroluminescent device 120, a first encapsulation layer 130, and a second encapsulation layer 140. The luminescent device is disposed on the substrate 110. The first encapsulation layer 130 is disposed on a side of the organic electroluminescent device 120 away from the substrate 110. The second encapsulation layer 140 is disposed on a side of the first encapsulation layer 130 away from the substrate 110. The first encapsulation layer 130 is configured to prevent a gas generated by the second encapsulation layer 140 from entering the organic electroluminescent device 120. The second encapsulation layer 140 is configured to prevent moisture or oxygen from entering the organic electroluminescent device 120.

The substrate 110 can be a rigid substrate 110 or a flexible substrate 110. The rigid substrate 110 can be a traditional glass substrate 110. The flexible substrate 110 may be a polyimide (PI) substrate 110. A formation process of the flexible substrate 110 generally uses a glass substrate as a rigid base. The flexible substrate 110 is formed on the glass substrate, and then a subsequent related panel manufacturing process is performed. The flexible substrate 110 is separated from the glass substrate, and the flexible substrate 110 is finally obtained.

Material of the second encapsulation layer 140 is mainly an organic matter, including an encapsulation adhesive 141 and a filling adhesive 143. In a process of encapsulating the organic electroluminescence module 100, the encapsulation adhesive 141 and the filling adhesive 143 are first coated on the cover plate 170 of the organic electroluminescence module 100, and then a side of the cover plate 170 coated with the encapsulation adhesive 141 and the filling adhesive 143 is turned to face the substrate 110, and the two are laminated together, such that the organic electroluminescent device 120 is disposed between the cover plate 170 and the substrate 110. At the same time, ultraviolet light irradiation and heating operations are performed on the encapsulation adhesive 141 and the filling adhesive 143, so that the encapsulation adhesive 141 and the filling adhesive 143 can be cured, thereby achieving a sealing effect.

The second encapsulation layer 140 has a relatively high viscosity and cannot be completely cured after being irradiated with ultraviolet light, that is, solvent, monomer, and photo-initiator are still present in the filling adhesive 143. In use, a solvent volatilization, a self-decomposition reaction of the monomer, or a reaction between the monomer and the initiator may generate small molecular substances such as ketones or aldehydes. The small molecular substances are volatile gases, such as formaldehyde or acetone. The gas may affect the organic electroluminescence module 100. For example, the structure of the organic electroluminescence module 100 is corroded, and holes, electrons, or excitons in the organic electroluminescence module 100 are deactivated.

The first encapsulation layer 130 is disposed between the second encapsulation structure and the organic electroluminescent device 120, so that the first encapsulation layer 130 can block the gas generated by the second encapsulation layer 140. In some embodiments, the first encapsulation layer 130 may be an active metal. A dense oxide film is formed on a surface of the active metal, which can block the gas generated by the second encapsulation layer 140. For example, material of the first encapsulation layer 130 is aluminum. It can be understood that aluminum is the active metal and can be oxidized in air to form a dense aluminum oxide film. The dense aluminum oxide film can block the gas generated by the second encapsulation layer 140. In other embodiments, the material of the first encapsulation layer 130 may be an inorganic substance. A gap between molecules of the inorganic substance is smaller than a diameter of molecules constituting the above-mentioned gas, so that the first encapsulation layer 130 can block the gas generated by the second encapsulation layer 140. In other embodiments, the material of the first encapsulation layer 130 may also have adsorption capacity, so that the molecules of the above gas can be adsorbed on the first encapsulation layer 130, so that the first encapsulation layer 130 can block the gas generated by the second encapsulation layer 140.

The organic electroluminescence module 100 of the embodiment of the present disclosure includes the substrate 110, the organic electroluminescent device 120 disposed on the substrate, the first encapsulation layer 130, and the second encapsulation layer 140. The first encapsulation layer 130 is configured to prevent the gas generated by the second encapsulation layer 140 from entering the organic electroluminescent device 120. The second encapsulation layer 140 is configured to prevent moisture or oxygen from entering the organic electroluminescent device 120. Therefore, the organic electroluminescence module 100 can prevent the gas generated by the second encapsulation layer 140 from corroding the organic electroluminescent device 120, ensure the stable performance of the organic electroluminescence module 100, and extend the lifespan of the organic electroluminescence module 100.

Referring to FIG. 2, which is a schematic diagram of a second structure of an organic electroluminescence module of an embodiment of the present disclosure.

In some embodiments, the material of the first encapsulation layer 130 is graphene, so that the first encapsulation layer 130 can absorb the gas generated by the second encapsulation layer 140. The graphene is a new material in which carbon atoms, connected though $sp^2$ hybridization, densely packed in a two dimensional honeycomb crystal lattice. The graphene has excellent optical, electrical, and mechanical properties, and has important application prospects in materials science, micro-nano processing, energy, biomedicine, and drug delivery. It is considered a revolutionary material in the future. The graphene can adsorb various atoms and molecules. It is understandable that when the material of the first encapsulation layer 130 is the graphene, it can not only adsorb the above gas, but also because graphene is hydrophobic, it also has a certain moisture and oxygen barrier capacity, which more effectively protects an internal structure of the organic electroluminescence module 100. For example, the graphene can not only adsorb formaldehyde or acetone, but also block water molecules.

In some embodiments, the organic electroluminescence module 100 further includes a third encapsulation layer 150. The third encapsulation layer 150 is disposed between the second encapsulation layer 140 and the organic electroluminescent device 120. The third encapsulation layer 150 can prevent the second encapsulation layer 140 from contacting the organic electroluminescent device 120.

Because material of the second encapsulation layer 140 is mainly organic matter. If the organic matter is in contact with the organic electroluminescent device 120, it will affect a performance of the organic electroluminescent device 120 or even cause the organic electroluminescent device 120 to fail. Therefore, the third encapsulation layer 150 is disposed between the second encapsulation layer 140 and the organic electroluminescent device 120 to prevent the organic matter of the second encapsulation layer 140 from contacting the organic electroluminescent device 120.

Material of the third encapsulation layer 150 is an inorganic substance, such as silicon nitride, silicon oxide, or silicon oxynitride. It can be understood that a thickness of the third encapsulation layer 150 is less than or equal to 1 μm, and can cover foreign matter less than or equal to 3 μm. However, the foreign matter may be generated when the organic electroluminescent device 120 is manufactured. The foreign matter can be dust or other particles. After the foreign matter pierces the third encapsulation layer 150, there will be a first gap between the third encapsulation layer 150 and the adjacent encapsulation layer. The first gap is likely to cause the accumulation of the above-mentioned gas, so that the first gap is enlarged. At the same time, the curing of the second encapsulation layer 140 is not complete, resulting in a larger molecular gap after curing of the organic matter. It is easy to form a second gap in the structure, which causes substances such as moisture in the atmosphere to sequentially pass through the second gap and the first gap until it passes through the third encapsulation layer 150, causing electrodes and the organic light-emitting layer of the organic electroluminescence module 100 to undergo electrochemical corrosion, thereby affecting the performance of the organic electroluminescence module 100 and shortening its lifespan.

Therefore, the first encapsulation layer 130 and the third encapsulation layer150 are arranged adjacently. The first encapsulation layer 130 can effectively adsorb the gas accumulated in the first gap and is also hydrophobic. That is, the first encapsulation layer 130 can make the organic electroluminescence module100 maintain good performance.

In some embodiments, the third encapsulation layer 150, the first encapsulation layer 130, and the second encapsulation layer 140 are sequentially stacked. That is, the third encapsulation layer 150 is disposed on a side of the light-emitting layer away from the substrate 110. Since the first encapsulation layer 130 is disposed between the second encapsulation layer 140 and the third encapsulation layer 150, the first encapsulation layer 130 can adsorb the above gas and block moisture in time. Thus, it prevents moisture and oxygen from entering the organic electroluminescence module 100 through the third encapsulation layer 150 from the source.

In some other embodiments, the first encapsulation layer 130, the third encapsulation layer 150, and the second encapsulation layer 140 are stacked in sequence. That is, the third encapsulation layer 150 is disposed between the first encapsulation layer 130 and the second encapsulation layer 140. The first encapsulation layer 130 serves as a protective barrier for the organic electroluminescence device. Moreover, since a residual amount of gas generated by the second encapsulation layer 140, external moisture, and oxygen after passing through the second encapsulation layer 140 and the third encapsulation layer 150 is small, they can be absorbed or blocked by the first encapsulation layer 130 more effectively. In addition, the first encapsulation layer 130 can absorb free hydrogen in the third encapsulation layer 150, so that the voltage of the organic electroluminescence module 100 is not negatively biased.

In some embodiments, the organic electroluminescent device 120 further includes a circuit layer 160. The circuit layer 160 is used to connect the display and pins of the organic electroluminescent device 120. The pins are configured to connect other components to the organic electroluminescent device 120. In addition, in order to make the second encapsulation layer 140 more effective in blocking moisture or oxygen, a water-absorbing adhesive 142 is provided between the encapsulation adhesive 141 and the filling adhesive 143. The water-absorbing adhesive 142 is composed of resin and calcium oxide molecules. The water-absorbing adhesive 142 is connected to the circuit layer 160, the cover plate 170, and the filling adhesive 143. The filling adhesive 143 is connected to the water-absorbing adhesive 142 and is disposed between the luminescent device and the cover plate 170.

The present disclosure also provides a display device, and the display panel includes the organic electroluminescence module 100.

Referring to FIG. 3 and FIG. 4, FIG. 3 is a flowchart of an encapsulating method of an organic electroluminescence module of an embodiment of the present disclosure, and FIG. 4 is a schematic diagram showing a process of manufacturing an organic electroluminescence module of an embodiment of the present disclosure.

The present disclosure also provides an encapsulating method of the organic electroluminescence module 100, including:

S11, a substrate 110 is provided, and an organic electroluminescent device 120 is formed on the substrate 110.

The method of forming the organic electroluminescent device 120 on the substrate 110 may include a physical vapor deposition, a chemical vapor deposition, sputtering, an evaporation, a spin coating, and the like.

The substrate 110 can be a rigid substrate 110 or a flexible substrate 110. The rigid substrate 110 can be a traditional glass substrate 110. The flexible substrate 110 may be a polyimide (PI) substrate 110. A formation process of the flexible substrate 110 generally uses a glass substrate as a rigid base. The flexible substrate 110 is formed on the glass substrate, and then a subsequent related panel manufacturing process is performed. The flexible substrate 110 is separated from the glass substrate, and the flexible substrate 110 is finally obtained.

S12, a first encapsulation layer 130 is formed on a side of the organic electroluminescent device 120 away from the substrate 110.

The method of forming the first encapsulation layer 130 on the side of the organic electroluminescent device 120 away from the substrate 110 may be a chemical vapor deposition.

S13, a second encapsulation layer 140 is formed on a side of the first encapsulation layer 130 away from the substrate 110.

The method of forming the second encapsulation layer 140 on the side of the first encapsulation layer 130 away from the substrate 110 may be coating.

The first encapsulation layer 130 can prevent a gas generated by the second encapsulation layer 140 from entering the organic electroluminescent device 120. The second encapsulation layer 140 can prevent moisture or oxygen from entering the organic electroluminescent device 120.

The second encapsulation layer 140 has a relatively high viscosity and cannot be completely cured after being irradiated with ultraviolet light, that is, solvent, monomer, and photo-initiator are still present in a filling adhesive 143. In use, a solvent volatilization, a self-decomposition reaction of the monomer, or a reaction between the monomer and the initiator may generate small molecular substances such as ketones or aldehydes. The small molecular substances are volatile gases, such as formaldehyde or acetone. The gas may affect the organic electroluminescence module 100. For example, the structure of the organic electroluminescence module 100 is corroded, and holes, electrons, or excitons in the organic electroluminescence module 100 are deactivated.

The first encapsulation layer 130 is disposed between the second encapsulation structure and the organic electroluminescent device 120, so that the first encapsulation layer 130 can block the gas generated by the second encapsulation layer 140. In some embodiments, the first encapsulation layer 130 may be an active metal. A dense oxide film is formed on a surface of the active metal, which can block the gas generated by the second encapsulation layer 140. For example, material of the first encapsulation layer 130 is aluminum. It can be understood that aluminum is the active metal and can be oxidized in air to form a dense aluminum oxide film. The dense aluminum oxide film can block the gas generated by the second encapsulation layer 140. In other embodiments, the material of the first encapsulation layer 130 may be an inorganic substance. A gap between molecules of the inorganic substance is smaller than a diameter of molecules constituting the above-mentioned gas, so that the first encapsulation layer 130 can block the gas generated by the second encapsulation layer 140. In other embodiments, the material of the first encapsulation layer 130 may also have adsorption capacity, so that the molecules of the above gas can be adsorbed on the first encapsulation layer 130, so that the first encapsulation layer 130 can block the gas generated by the second encapsulation layer 140.

In some embodiments, the material of the first encapsulation layer 130 is graphene, so that the first encapsulation layer 130 can absorb the gas generated by the second encapsulation layer 140. The graphene is a new material in which carbon atoms, connected though $sp^2$ hybridization, densely packed in a two dimensional honeycomb crystal lattice. The graphene has excellent optical, electrical, and mechanical properties, and has important application prospects in materials science, micro-nano processing, energy, biomedicine, and drug delivery. It is considered a revolutionary material in the future. The graphene can adsorb various atoms and molecules. It is understandable that when the material of the first encapsulation layer 130 is the graphene, it can not only adsorb the above gas, but also because graphene is hydrophobic, it also has a certain moisture and oxygen barrier capacity, which more effectively protects an internal structure of the organic electroluminescence module 100. For example, the graphene can not only adsorb formaldehyde or acetone, but also block water molecules.

In some embodiments, after forming the second encapsulation layer 140 on the side of the first encapsulation layer 130 away from the substrate 110, the method further includes:

A third encapsulation layer 150 is formed on a side of the first encapsulation layer 130 away from the substrate 110, so that the third encapsulation layer 150 can prevent an organic matter of the second encapsulation layer 140 from contacting the organic electroluminescent device 120.

Because material of the second encapsulation layer 140 is mainly the organic matter. If the organic matter is in contact with the organic electroluminescent device 120, it will affect a performance of the organic electroluminescent device 120 or even cause the organic electroluminescent device 120 to fail. Therefore, the third encapsulation layer 150 is disposed between the second encapsulation layer 140 and the organic electroluminescent device 120 to prevent the organic matter of the second encapsulation layer 140 from contacting the organic electroluminescent device 120.

Material of the third encapsulation layer 150 is an inorganic substance. It can be understood that a thickness of the third encapsulation layer 150 is less than or equal to 1 and can cover foreign matter less than or equal to 3 However, the foreign matter may be generated when the organic electroluminescent device 120 is manufactured. The foreign matter can be dust or other particles. After the foreign matter pierces the third encapsulation layer 150, there will be a first gap between the third encapsulation layer 150 and the adjacent encapsulation layer. The first gap is likely to cause the accumulation of the above-mentioned gas, so that the first gap is enlarged. At the same time, the curing of the second encapsulation layer 140 is not complete, resulting in a larger molecular gap after curing of the organic matter. It is easy to form a second gap in the structure, which causes substances such as moisture in the atmosphere to sequentially pass through the second gap and the first gap until it passes through the third encapsulation layer 150, causing electrodes and the organic light-emitting layer of the organic electroluminescence module 100 to undergo electrochemical corrosion, thereby affecting the performance of the organic electroluminescence module 100 and shortening its lifespan.

Therefore, the first encapsulation layer 130 and the third encapsulation layer150 are arranged adjacently. The first encapsulation layer 130 can effectively adsorb the gas accumulated in the first gap and is also hydrophobic. That is, the first encapsulation layer 130 can make the organic electroluminescence module100 maintain good performance.

In some embodiments, the encapsulating method of the organic electroluminescence module 100 further includes forming a circuit layer 160 on the substrate 110. The circuit layer 160 is connected to the organic electroluminescent device 120. The circuit layer 160 is formed on the substrate 110. The circuit layer 160 is connected to the organic electroluminescent device 120. A cover plate170 is provided. The step of forming the second encapsulation layer 140 on the side of the first encapsulation layer 130 away from the substrate 110 includes: an encapsulation adhesive 141, a water-absorbing adhesive 142, and a filling adhesive 143 are coated on the cover plate 170. A side of the cover plate 170 coated with the encapsulation adhesive 141, the water-absorbing adhesive 142, and the filling adhesive 143 is turned to face the substrate 110, and the two are laminated together. Thus, the encapsulation adhesive 141 is connected to the circuit layer 160 and the cover plate 170. The water-absorbing adhesive 142 is connected to the circuit layer 160, the cover plate 170, and the filling adhesive 143. The filling adhesive 143 is connected to the water-absorbing adhesive 142 and is disposed between the luminescent device and the cover plate 170.

Material of the second encapsulation layer 140 is mainly an organic matter, including the encapsulation adhesive 141, the water-absorbing adhesive 142, and the filling adhesive 143. In a process of encapsulating the organic electroluminescence module 100, the encapsulation adhesive 141 and the filling adhesive 143 are first coated on the cover plate 170 of the organic electroluminescence module 100, and then the side of the cover plate 170 coated with the encapsulation adhesive 141 and the filling adhesive 143 is turned to face the substrate 110, and the two are laminated together, such that the organic electroluminescent device 120 is disposed between the cover plate 170 and the substrate 110. At the same time, ultraviolet light irradiation and heating operations are performed on the encapsulation adhesive 141 and the filling adhesive 143, so that the encapsulation adhesive 141 and the filling adhesive 143 can be cured, thereby achieving a sealing effect.

The organic electroluminescence module 100 of the embodiment of the present disclosure includes the substrate, the organic electroluminescent device 120 disposed on the substrate, the first encapsulation layer 130, and the second encapsulation layer 140. The first encapsulation layer 130 is configured to prevent the gas generated by the second encapsulation layer 140 from entering the organic electroluminescent device 120. The second encapsulation layer 140 is configured to prevent moisture or oxygen from entering the organic electroluminescent device 120. Therefore, the organic electroluminescence module 100 can prevent the gas generated by the second encapsulation layer 140 from corroding the organic electroluminescent device 120, ensure the stable performance of the organic electroluminescence module 100, and extend the lifespan of the organic electroluminescence module 100.

In the above-mentioned embodiments, the description of each embodiment has its own focus. For parts that are not described in detail in an embodiment, reference may be made to related descriptions of other embodiments.

In the description of the present disclosure, terms "first" and "second" are only used for descriptive purposes, and cannot be understood as indicating or implying relative importance or implicitly indicating the number of indicated technical features. Therefore, the features defined with "first" and "second" may explicitly or implicitly include one or more features.

The organic electroluminescence module, the encapsulating method thereof, and the display device provided by the embodiments of the present disclosure are described in detail above. Specific examples are used in this specification to describe the principles and implementations of the present disclosure, and the descriptions of the above examples are only used to help understand the present disclosure. At the same time, for those skilled in the art, according to the idea of the present disclosure, there will be changes in the specific implementation and the scope of the present disclosure. In summary, the content of this specification should not be construed as a limitation to the present disclosure.

What is claimed is:

1. An organic electroluminescence module, comprising:
a substrate;
an organic electroluminescent device disposed on the substrate;
a first encapsulation layer disposed on a side of the organic electroluminescent device away from the substrate; and
a second encapsulation layer disposed on a side of the first encapsulation layer away from the substrate;
wherein the first encapsulation layer is configured to prevent a gas generated by the second encapsulation layer from entering the organic electroluminescent device, and the second encapsulation layer is configured to prevent moisture or oxygen from entering the organic electroluminescent device;
the organic electroluminescence module further comprises:
a circuit layer and a cover plate, wherein the circuit layer is disposed on the substrate and connected to the luminescent device, and the cover plate is disposed on the side of the first encapsulation layer away from the substrate;
wherein the second encapsulation layer comprises an encapsulation adhesive, a water-absorbing adhesive, and a filling adhesive, the encapsulation adhesive is connected to the circuit layer and the cover plate, the water-absorbing adhesive is connected to the circuit layer, the cover plate, and the filling adhesive, and the filling adhesive is connected to the water-absorbing adhesive and is disposed between the luminescent device and the cover plate.

2. The organic electroluminescence module according to claim 1, wherein the first encapsulation layer is configured to absorb the gas generated by the second encapsulation layer.

3. The organic electroluminescence module according to claim 2, wherein material of the first encapsulation layer is graphene.

4. The organic electroluminescence module according to claim 1, further comprising a third encapsulation layer disposed between the second encapsulation layer and the organic electroluminescent device, wherein the third encapsulation layer is configured to prevent the second encapsulation layer from contacting the organic electroluminescent device.

5. The organic electroluminescence module according to claim 4, wherein the first encapsulation layer, the third encapsulation layer, and the second encapsulation layer are sequentially stacked.

6. The organic electroluminescence module according to claim 1, wherein material of the first encapsulation layer is aluminum oxide.

7. An encapsulating method of an organic electroluminescence module, comprising:
    providing a substrate, and forming an organic electroluminescent device on the substrate;
    forming a first encapsulation layer on a side of the organic electroluminescent device away from the substrate; and
    forming a second encapsulation layer on a side of the first encapsulation layer away from the substrate;
    wherein the first encapsulation layer is configured to prevent a gas generated by the second encapsulation layer from entering the organic electroluminescent device, and the second encapsulation layer is configured to prevent moisture or oxygen from entering the organic electroluminescent device;
    wherein after providing the substrate and forming the organic electroluminescent device on the substrate, the method further comprises:
    forming a circuit layer on the substrate, wherein the circuit layer is connected to the organic electroluminescent device; and
    providing a cover plate;
    wherein the step of forming the second encapsulation layer on the side of the first encapsulation layer away from the substrate comprises:
    coating an encapsulation adhesive, a water-absorbing adhesive, and a filling adhesive on the cover plate; and
    turning a side of the cover plate coated with the encapsulation adhesive, the water-absorbing adhesive, and the filling adhesive to face the substrate, and laminating the two together, such that the encapsulation adhesive is connected to the circuit layer and the cover plate, the water-absorbing adhesive is connected to the circuit layer, the cover plate, and the filling adhesive, and the filling adhesive is connected to the water-absorbing adhesive and is disposed between the luminescent device and the cover plate.

8. The encapsulating method of the organic electroluminescence module according to claim 7, wherein after forming the second encapsulation layer on the side of the first encapsulation layer away from the substrate, the method further comprises:
    forming a third encapsulation layer on the side of the first encapsulation layer away from the substrate, wherein the third encapsulation layer is configured to prevent an organic matter of the second encapsulation layer from contacting the organic electroluminescent device.

9. The encapsulating method of the organic electroluminescent device according to claim 7, wherein the step of forming the first encapsulation layer on the side of a main body of the luminescent device away from the substrate comprises:
    forming the first encapsulation layer on the side of the main body of the luminescent device away from the substrate by a chemical vapor deposition process.

10. A display device, comprising an organic electroluminescence module, wherein the organic electroluminescence module comprises:
    a substrate;
    an organic electroluminescent device disposed on the substrate;
    a first encapsulation layer disposed on a side of the organic electroluminescent device away from the substrate; and
    a second encapsulation layer disposed on a side of the first encapsulation layer away from the substrate;
    wherein the first encapsulation layer is configured to prevent a gas generated by the second encapsulation layer from entering the organic electroluminescent device, and the second encapsulation layer is configured to prevent moisture or oxygen from entering the organic electroluminescent device;
    the organic electroluminescence module further comprises a circuit layer and a cover plate, wherein the circuit layer is disposed on the substrate and connected to the luminescent device, and the cover plate is disposed on the side of the first encapsulation layer away from the substrate;
    wherein the second encapsulation layer comprises an encapsulation adhesive, a water-absorbing adhesive, and a filling adhesive, the encapsulation adhesive is connected to the circuit layer and the cover plate, the water-absorbing adhesive is connected to the circuit layer, the cover plate, and the filling adhesive, and the filling adhesive is connected to the water-absorbing adhesive and is disposed between the luminescent device and the cover plate.

11. The display device according to claim 10, wherein the first encapsulation layer is configured to absorb the gas generated by the second encapsulation layer.

12. The display device according to claim 11, wherein material of the first encapsulation layer is graphene.

13. The display device according to claim 10, further comprising a third encapsulation layer disposed between the second encapsulation layer and the organic electroluminescent device, wherein the third encapsulation layer is configured to prevent the second encapsulation layer from contacting the organic electroluminescent device.

14. The display device according to claim 13, wherein the first encapsulation layer, the third encapsulation layer, and the second encapsulation layer are sequentially stacked.

15. The display device according to claim 10, wherein material of the first encapsulation layer is aluminum oxide.

* * * * *